(12) United States Patent
Ungerboeck et al.

(10) Patent No.: US 8,000,387 B2
(45) Date of Patent: *Aug. 16, 2011

(54) SYSTEM AND METHOD FOR HUFFMAN SHAPING IN A DATA COMMUNICATION SYSTEM

(75) Inventors: Gottfried Ungerboeck, Langnau a.A. (CH); Arthur J. Carlson, Nevada City, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/751,647

(22) Filed: Mar. 31, 2010

(65) Prior Publication Data
US 2010/0246661 A1 Sep. 30, 2010

Related U.S. Application Data

(63) Continuation of application No. 12/326,559, filed on Dec. 2, 2008, now Pat. No. 7,697,606, which is a continuation of application No. 11/188,301, filed on Jul. 25, 2005, now Pat. No. 7,460,595, which is a continuation of application No. 09/898,850, filed on Jul. 3, 2001, now Pat. No. 7,106,794.

(60) Provisional application No. 60/224,733, filed on Aug. 11, 2000.

(51) Int. Cl.
*H04B 1/66* (2006.01)
(52) U.S. Cl. ........ 375/240; 375/261; 375/285; 375/296; 341/65; 348/384.1

(58) Field of Classification Search .......... 375/261–265, 375/254, 285, 296–298; 704/500, 501, 503, 704/504; 341/200, 384, 65
See application file for complete search history.

(56) References Cited

U.S. PATENT DOCUMENTS

| | | | |
|---|---|---|---|
| 4,586,182 A | 4/1986 | Gallager | |
| 5,057,917 A * | 10/1991 | Shalkauser et al. | 375/240.12 |
| 5,115,453 A | 5/1992 | Calderbank et al. | |
| 5,140,417 A | 8/1992 | Tanaka et al. | |
| 5,253,078 A | 10/1993 | Balkanski et al. | |
| 5,268,961 A | 12/1993 | Ng | |
| 5,297,170 A | 3/1994 | Eyuboglu et al. | |
| 5,388,124 A | 2/1995 | Laroia et al. | |
| 5,528,628 A | 6/1996 | Park et al. | |

(Continued)

FOREIGN PATENT DOCUMENTS
DE 197 48 880 C 1 5/1999

OTHER PUBLICATIONS

B. Vasic et al., "Scrambling for Nonequiprobable Signalling," Electronics Letters, IEE Stevenage, GB, vol. 32, No. 17, Aug. 15, 1996, pp. 1551-1552.

(Continued)

*Primary Examiner* — Dac V Ha
(74) *Attorney, Agent, or Firm* — McAndrew, Held & Mallory, Ltd.

(57) ABSTRACT

In a communication system, Huffman coding techniques are used to obtain shaping gains for an improvement in data transmission rates. More particularly, a novel method of Huffman shaping is described that achieves a shaping gain of greater than 1 dB. The shaping gain results in a higher data rate transmission in a communication system where transmitted power is constrained.

33 Claims, 13 Drawing Sheets

U.S. PATENT DOCUMENTS

| | | | |
|---|---|---|---|
| 5,559,561 A | | 9/1996 | Wei |
| 5,675,332 A | * | 10/1997 | Limberg .................... 341/67 |
| 5,714,950 A | | 2/1998 | Jeong et al. |
| 5,850,260 A | * | 12/1998 | Rosenberg ............... 375/240.16 |
| 5,914,840 A | | 6/1999 | Kawakami et al. |
| 6,064,954 A | | 5/2000 | Cohen et al. |
| 6,208,274 B1 | | 3/2001 | Taori et al. |
| 6,643,402 B1 | * | 11/2003 | Okada ........................ 382/232 |
| 6,678,334 B1 | | 1/2004 | Lee |
| 6,912,070 B1 | * | 6/2005 | Govindaswamy et al. ........................ 375/240.23 |
| 7,043,088 B2 | | 5/2006 | Chiu et al. |
| 7,308,099 B1 | | 12/2007 | Allamanche et al. |

OTHER PUBLICATIONS

G. Ungerboeck, "Chapter 11: Huffman Shaping," *Codes, Graphs, and Systems*, Mar. 2002, pp. 295-310.

G. Ungerboeck, "Information—Theoretic Reflections on PCM Voiceband Modems," in *Codes, Curves, and Signals—Common Threads in Communications*, edited by A. Vardy, Kluwer Academic Publishers, 1998, pp. 193-200.

G. Ungerboeck, "Trellis-Coded Modulation with Redundant Signal Sets Part II: State of the Art," IEEE Communications Magazine, vol. 25, No. 2, Feb. 1987, pp. 12-21.

F.R. Kschischang, "Optimal Nonuniform Signaling for Gaussian Channels," 39 IEEE Transactions on Information Theory, No. 3, May 1993, pp. 913-929.

S. McLaughlin et al., "Shaping Codes Constructed from Cost-Constrained Graphs," 43 IEEE Transactions on Information Theory, No. 2, Mar. 1997, pp. 692-699.

J. Abrahams, "Variable-Length Unequal Cost Parsing and Coding for Shaping," 44 IEEE Transactions on Information Theory, No. 3, No. 4, Jul. 1998, pp. 1648-1650.

R. Blahut, "Computation of Channel Capacity and Rate-Distortion Functions," IEEE Transactions on Information Theory, vol. IT-18, No. 4, Jul. 1972, pp. 460-473.

D.A. Huffman, "A Method for the construction of minimum-redundancy codes," Proc. IRE, vol. 40, 1952, pp. 1098-1101.

M. Tomlinson, "New automatic equalizer employing modulo arithmetic," Electron. Lett., vol. 7, Mar. 1971, pp. 138-139.

G. D. Forney, Jr., "Trellis shaping," IEEE Trans. Inform. Theory, vol. 38, Mar. 1992, pp. 281-300.

P. Fortier, et al., "Multidimensional signal sets through the shell construction for parallel channels," IEEE Trans. Commun., vol. 40, Mar. 1992, pp. 500-512.

A. K. Khandani et al., "Shaping multidimensional signal spaces—Part I: Optimum shaping, shell mapping," IEEE Trans. Inform. Theory, vol. 39, Nov. 1993, pp. 1799-1808.

G. R. Lang et al., "A Leech lattice modem," IEEE J. Select. Areas Commun., vol. 7, Aug. 1989, pp. 968-973.

G. Ungerboeck et al., Broadcom Corporation, "Coding for V.90 Issue 2," TR-30.1/99-11-064R1, Telecommunications Industry Association, Clearwater Beach, FL, Nov. 29, 1999.

G. Ungerboeck, "Channel Coding with Multilevel/Phase Signals," IEEE Transactions on Information Theory, vol. IT-28, No. 1, Jan. 1982, pp. 55-67.

G. Ungerboeck, "Trellis-coded Modulation with Redundant Signal Sets, Part 1: Introduction," IEEE Communications Magazine, vol. 25, No. 2, Feb. 1987, pp. 5-11.

"Series V: Data Communication over the Telephone Network," ITU-T Recommendation V.90 (Sep. 1998).

H. Harashima et al., "Marched-transmission technique for channels with intersymbol interference," IEEE Trans. Commun., vol. COM-20, Aug. 1972, pp. 774-780.

R. Laroia, N. Farvardin and S. Tretter, "On optimal shaping of multi-dimensional constellations," IEEE Trans. Inform. Theory, vol. 40, Jul. 1994, pp. 1044-1056.

G.D. Forney et al., "Modulation and coding for linear Gaussian channels," IEEE Trans. Inform. Theory. vol. 44, No. 6, Oct. 1998, pp. 2384-2415.

G.D. Forney et al., "Multidimensional constellations—Part I: Introduction, figures of merit, and generalized cross constellations," IEEE J. Select. Areas Commun., vol. 7, No. 6, Aug. 1989, pp. 877-892.

T.M. Cover, et al., *Elements of Information Theory*, Wiley Series in Telecommunications, A Wiley-Interscience Publication, 1991, pp. 1-542.

J.M. Wozencraft et al., *Principles of Communication Engineering*, Chapter 6—"Implementation of Coded Systems," John Wiley & Sons, Inc., 1965, pp. 363-484.

ITU-T Recommendation V.90 (Sep. 1998).

ITU-T Recommendation V.34 (Feb. 1998).

* cited by examiner

SYSTEM AND METHOD FOR HUFFMAN SHAPING IN A DATA COMMUNICATION SYSTEM

CROSS-REFERENCE TO RELATED APPLICATIONS

The present application is a CONTINUATION of U.S. patent application Ser. No. 12/326,559, filed Dec. 2, 2008, which is a CONTINUATION of U.S. application Ser. No. 11/188,301, filed Jul. 25, 2005, now issued U.S. Pat. No. 7,460,595, which is a CONTINUATION of U.S. application Ser. No. 09/898,850, filed Jul. 3, 2001, now issued U.S. Pat. No. 7,106,794. Said U.S. application Ser. No. 09/898,850 claims benefit from and priority to U.S. Application No. 60/224,733, filed Aug. 11, 2000. The above-identified applications are hereby incorporated herein by reference in their entirety.

INCORPORATION BY REFERENCE

The above-referenced U.S. provisional application Ser. No. 60/224,733 is hereby incorporated herein by reference in its entirety.

STATEMENT REGARDING FEDERALLY SPONSORED RESEARCH OR DEVELOPMENT

N/A

BACKGROUND OF THE INVENTION

Current data communication systems rarely approach highest possible rate, i.e., the rate corresponding to Shannon channel capacity. For example, voiceband modems complying with ITU-T recommendation V.90 employ uncoded modulation for downstream transmission. The nominal downstream rate of 56 kbit/s is thereby almost never achieved, although under practical channel conditions the capacity rate can exceed 56 kbit/s.

The difference between the signal-to-noise ratio (SNR) required to accomplish a given rate with a given practical coding and modulation scheme and the SNR at which an ideal capacity-achieving scheme could operate at the same rate is known as "SNR gap to capacity". At spectral efficiencies of 3 bit per signal dimension or higher, uncoded modulation with equiprobable PAM (pulse amplitude modulation) and QAM (quadrature amplitude modulation) symbols exhibit an SNR gap of 9 dB at a symbol error probability of $10^{-6}$. In the case of V.90 downstream transmission, the SNR gap can correspond to a rate loss of up to 12 kbit/s.

This overall 9 dB gap is generally comprised of a "shaping gap" portion and a "coding gap" portion. The "shaping gap" portion (approximately 1.5 dB) is caused by the absence of constellation shaping (towards a Gaussian distribution). The remaining "coding gap" portion (approximately 7.5 dB) stems from the lack of sequence coding to increase signal distances between permitted symbol sequences.

Two different techniques are used, generally in combination, to reduce the overall 9 dB gap. The first technique addresses the "coding gap" portion, and uses one of several coding techniques to achieve coding gains. One of these techniques is trellis-coded modulation. More recent techniques employ serial- or parallel-concatenated codes and iterative decoding (Turbo coding). These latter techniques can reduce the coding gap by about 6.5 dB, from 7.5 dB to about 1 dB.

Once a coding gain is achieved, the second technique, referred to as shaping, can be used to achieve an even further gain. This type of gain is generally referred to as a shaping gain. Theoretically, shaping is capable of providing an improvement (i.e., shaping gain) of up to 1.53 dB.

Two practical shaping techniques have been employed in the prior art to achieve shaping gains, namely, trellis shaping and shell mapping. With 16-dimensional shell mapping, such as employed in V.34 modems, for example, a shaping gain of about 0.8 dB can be attained. Trellis shaping can provide a shaping gain of about 1 dB at affordable complexity. Accordingly, between 0.5 and 0.7 dB of possible shaping gain remains untapped by these prior art shaping methods.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Aspects of the present invention may be found in a method of communicating data in a communication system. The method generally comprises accepting and randomizing (scrambling) data from a source of user data, such as a computer, for example. The randomized data are accumulated until a Huffman codeword is recognized, at which time the Huffman codeword is mapped into a channel symbol. Then the channel symbol is applied to an input of a communication channel. In the field of source coding, the above operation is known as Huffman decoding.

The encoding operation described above may be combined with further channel encoding operations such as, for example, trellis coded modulation or some form of serial- or parallel-concatenated coding to achieve coding gain in addition to shaping gain. In addition, channel symbols can be modulated in various ways before they are applied to the input of the communication channel.

In one embodiment of the invention, the channel encoding operation described above is performed in combination with a framing operation to achieve transmission of data at a constant rate.

Next, on the receiver side of the communication channel, a channel symbol is received from an output of the communication channel after suitable demodulation and channel decoding. Once obtained, the channel symbol is converted into the corresponding Huffman codeword. The data sequence represented by concatenated Huffman codewords is de-randomized (descrambled) and delivered to a sink of user data.

In one embodiment of the invention, a deframing operation is performed, which provides for data delivery to the data sink at constant rate.

The method of the present invention results in a symbol constellation and a probability distribution of symbols in this constellation that exhibits a shaping gain of greater than 1 dB. The shaping gain may be, for example, 1.35 dB or 1.5 dB, depending on the specific design In general, a communication system according to the present invention comprises a communication node that performs a "Huffman decoding" operation to generate channel symbols with a desired probability distribution.

These and other advantages and novel features of the present invention, as well as details of an illustrated embodiment thereof, will be more fully understood from the following description and drawings.

DETAILED DESCRIPTION OF THE INVENTION

Figure 1:
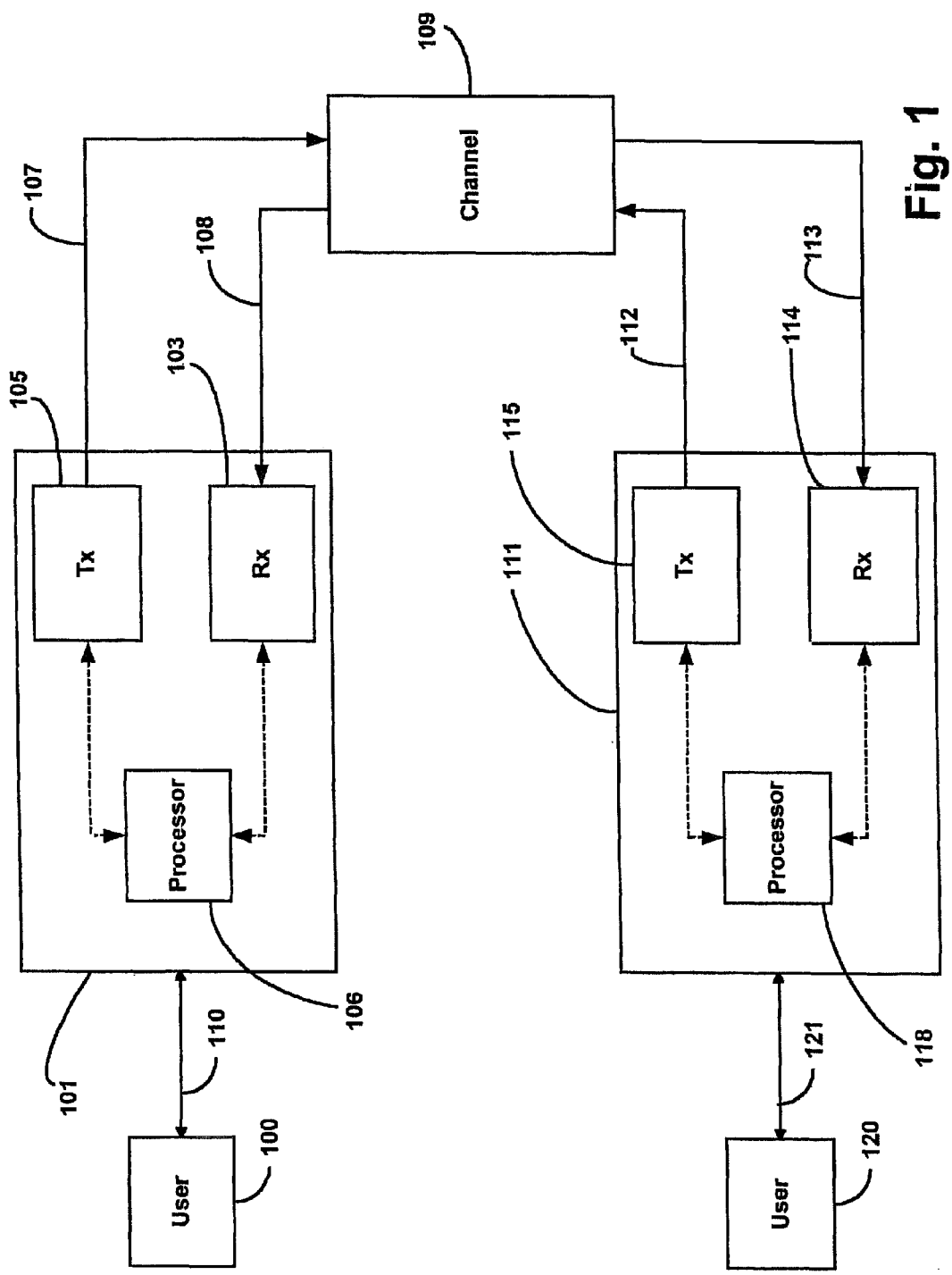
FIG. 1 is a block diagram of a generic communication system that may be employed in connection with the present invention.

FIG. 1 is a block diagram of a generic communication system that may be employed in connection with the present invention. The system comprises a first communication node 101, a second communication node 111, and a channel 109 that communicatively couples the nodes 101 and 111. The communication nodes may be, for example, modems or any other type of transceiver device that transmits or receives data over a channel. The first communication node 101 comprises a transmitter 105, a receiver 103 and a processor 106. The processor 106 may comprise, for example, a microprocessor. The first communication node 101 is communicatively coupled to a user 100 (e.g., a computer) via communication link 110, and to the channel 109 via communication links 107 and 108.

Similarly, the second communication node 111 comprises a transmitter 115, a receiver 114 and a processor 118. The processor 118, like processor 106, may comprise, for example, a microprocessor. The second communication node 111 is likewise communicatively coupled to a user 120 (again a computer, for example) via communication link 121, and to the channel 109 via communication links 112 and 113.

During operation, the user 100 can communicate information to the user 120 using the first communication node 101, the channel 109 and the second communication node 111. Specifically, the user 100 communicates the information to the first communication node 101 via communication link 110. The information is transformed in the transmitter 105 to match the restrictions imposed by the channel 109. The transmitter 105 then communicates the information to the channel 109 via communication link 107. The receiver 114 of the second communication node 111 next receives, via communication link 113, the information from the channel 109, and transforms it into a form usable by the user 120. Finally, the information is communicated from the second communication node 111 to the user 120 via the communication link 121.

Communication of information from the user 120 to the user 100 may also be achieved in a similar manner. In either case, the information transmitted/received may also be processed using the processors 106/118.

Figure 2:
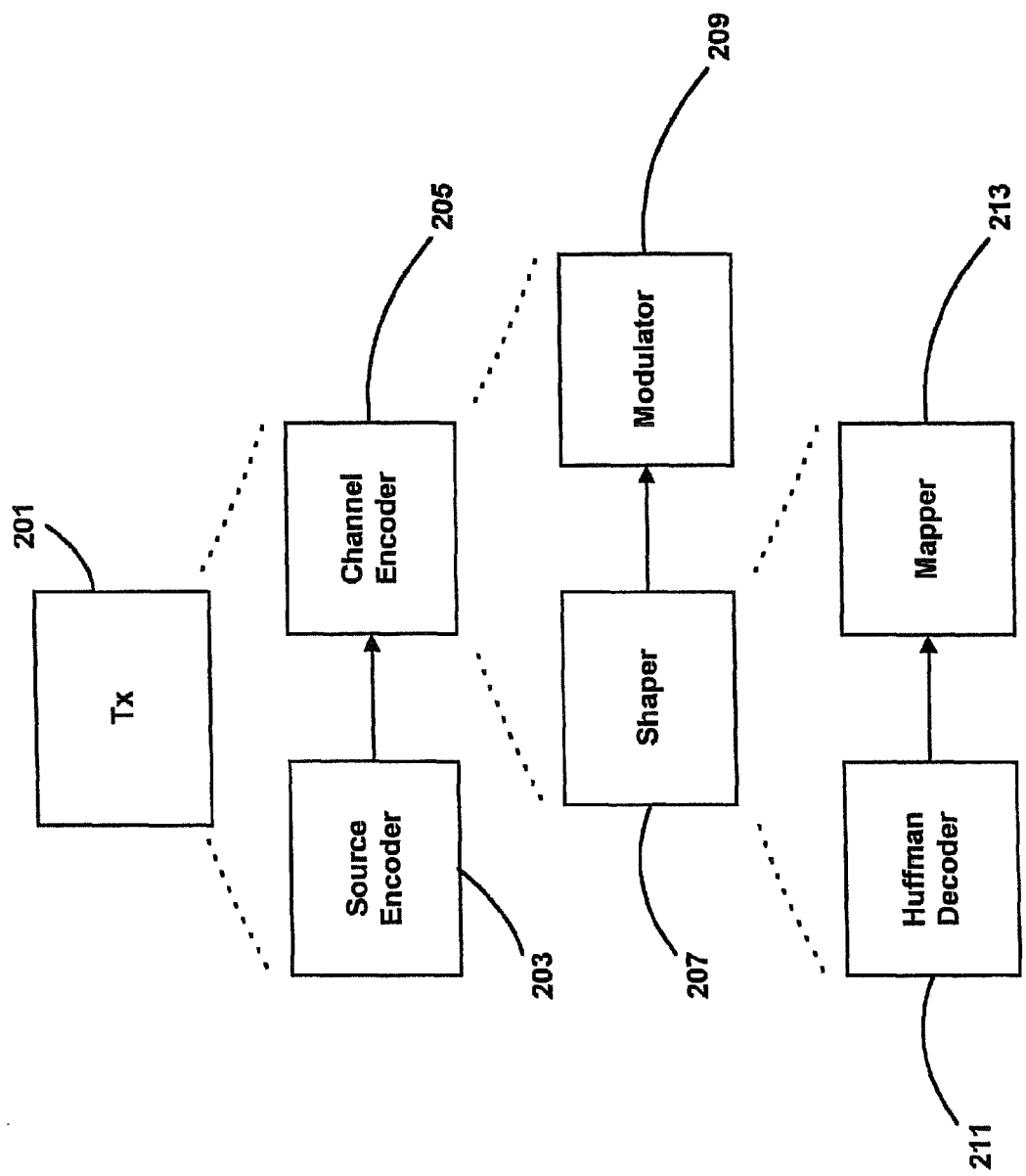
FIG. 2 illustrates additional detail regarding the transmitters of FIG. 1 according to the present invention.

FIG. 2 illustrates additional detail regarding the transmitters of FIG. 1 according to the present invention. The functions of transmitter 201 may be decomposed into those of a source encoder 203 and a channel encoder 205. Generally, the source encoder 203 is a device that transforms the data produced by a source (such as the user 100 or user 120 of FIG. 1) into a form convenient for use by the channel encoder 205. For example, the source may produce analog samples at a certain rate, such as, for example, 8000/s, as in a telephone application. The source encoder 203 then may perform the function of analog-to-digital conversion, converting each analog sample into an 8-bit binary code. The output of the source encoder 203 then would be a binary sequence of digits presented to the input of the channel encoder 205 at a rate of 8×8000=64,000 bit/s. The output of the source encoder 203 is passed to the channel encoder 205, where the data are transformed into symbols that can be transmitted on the channel. For example, the data may be transformed using pulse-amplitude modulation (PAM), whereby successive short blocks of data bits of length N are encoded as analog pulses having one of $2^N$ allowable amplitudes.

In most communication systems, the data presented to the channel encoder are assumed to be completely random. This randomness is normally assured by the inclusion of a scrambler designed into the system. In the previous example of PAM, random data would lead to each $2^N$ of the allowable amplitudes being equally likely. That is, each of them occurs with probability $2^{-N}$. It turns out that employing equally likely pulse amplitudes leads to a small inefficiency in the use of the power in the signal that is transmitted into the channel. In fact, as mentioned above, if the amplitude distribution can be made more nearly Gaussian, then up to 1.53 dB of transmitted power can be saved for the same level of error performance at the receiver.

Accordingly, a shaping function is provided in FIG. 2 by a shaper 207, which alters the statistical distribution of the values presented to modulator 209. Shaping the transmitted signal generally means controlling the distribution of transmitted signal values to make the signal appear more Gaussian in character. The shaper 207 comprises a Huffman decoder 211 and a mapper 213. The design of the Huffman decoder 211 depends upon the characteristics of the channel.

In the Huffman decoder 211, the sequence of scrambled binary data bits is parsed into Huffman codewords. The codewords are then mapped into modulation symbols. The Huffman code is designed to let the modulation symbols assume approximately a sampled Gaussian distribution.

Unlike trellis shaping or shell mapping, Huffman shaping is not a constant-rate-encoding scheme. Moreover, decoding errors can lead to bit insertion or deletion in the decoded binary data sequence. This may be acceptable for many systems, such as, for example, those in which variable-length packets are transmitted in burst mode with an Ethernet-like medium access protocol. In some cases, continuous transmission at constant rate is desirable, such as, for example, those involving variable-rate encoded voice and video streams over constant rate channels. A constant rate and recovery from bit insertions and deletions may be achieved, and the framing overhead may be kept to a value equivalent to a SNR penalty of ≈0.1 dB, for example, utilizing the method of the present invention.

The following mathematical foundation of Huffman shaping is based upon M-ary PAM data transmission, but the concept clearly applies to two- and higher-dimensional modulation as well.

Let $A_M$ be a symmetric M-ary PAM constellation of equally spaced symbols. Adjacent symbols are spaced by 2, and M may be even or odd (usually M will be even):

$$A_M = \{a_i = -(M-1) + 2i, 0 \leq i \leq M-1\} \quad (1)$$

e.g.: $A_8 = \{-7, -5, -3, -1, +1, +3, +5, +7\}$, $A_5 = \{-4, -2, 0, +2, +4\}$

If symbols are selected independently with probabilities $p = \{p_i, 0 \leq i \leq M-1\}$, the symbol entropy $H(p)$ (=rate) and the average symbol energy $E(p)$ become:

$$H(p) = -\sum_{i=0}^{M-1} p_i \log_2 p_i \text{ bit/symbol} \quad (2)$$

$$\left(p_i = \frac{1}{M} \forall i : H(p) = H_M = \log_2 M\right),$$

$$E(p) = \sum_{i=0}^{M-1} p_i |a_i|^2 \quad (3)$$

$$\left(M - PAM, p_i = \frac{1}{M} \forall i : E(p) = E_M = \frac{M^2 - 1}{3}\right).$$

Shaping gain $G_s(p)$ expresses a saving in average symbol energy achieved by choosing symbols from $A_M$ with probabilities p rather than selecting equiprobable symbols from a smaller constellation $A_{M'}$, where $M' = 2^{H(p)}$ (M'<M, ignoring that M' may not be an integer):

$$G_s(p) = \frac{E_{M'}}{E(p)} = \frac{2^{2H(p)} - 1}{3 \times E(p)}. \quad (4)$$

The maximum shaping gain is obtained by the probability distribution $p = \tilde{p}$, which minimizes $E(p)$ subject to the constraints $R = H(p)$ and $$\sum_{i=0}^{M-1} p_i = 1.$$

Differentiation of $$J(p) = \sum_{i=0}^{M-1} p_i |a_i|^2 + \lambda_1 \left(-\sum_{i=0}^{M-1} p_i \log_2 p_i - R\right) + \lambda_2 \left(\sum_{i=0}^{M-1} p_i - 1\right) \quad (5)$$

with respect to the probabilities $p_i$ yields the conditions $$\frac{\partial J(p)}{\partial p_i}\bigg|_{p=\tilde{p}} = |a_i|^2 - \frac{\lambda_1}{\ln 2}(\ln \tilde{p}_i + 1) + \lambda_2 = 0, \quad (6)$$

for $$0 \leq i \leq M - 1.$$

The parametric solution of (6), with the Lagrange multipliers $\lambda_1, \lambda_2$ transformed into the new variables α, s, becomes $$\tilde{p}_i = \exp\left(-1 + \frac{\ln 2}{\lambda_1}(|a_i|^2 + \lambda_2)\right) \quad (7)$$

$$= \alpha \exp(-s|a_i|^2), \quad 0 \leq i \leq M - 1.$$

The optimum distribution $\tilde{p}$ is thus found to be a Gaussian distribution sampled at the symbol values of $A_M$. This solution can also be obtained by maximizing the rate $R = H(p)$ subject to the constraints $E(p) = S$ and $$\sum_{i=0}^{M-1} p_i = 1.$$

The value of α follows from $$\sum_{i=0}^{M-1} p_i = 1.$$

The value of s may be chosen to achieve a given rate $R \leq \log_2(M)$ or a given average symbol energy $S \leq E_M$.

If M and R are increased, the optimum shaping gain tends towards the ultimate shaping gain $G_s^\infty = \pi e/6 = 1.423$ (1.53 dB). This gain can be derived as the ratio of the variance of a uniform density over a finite interval and the variance of a Gaussian density, both with the same differential entropy.

One can see that (7) does not only hold for regular symmetric PAM constellations, but gives the optimum shaping probabilities for arbitrary one- and higher-dimensional symbol constellations as well.

In general, given a sequence of M-ary source symbols which occur independently with probability distribution p, a traditional Huffman coding approach encodes the source symbols into binary codewords of variable lengths such that (a) no codeword is a prefix of any other codeword (prefix condition), and (b) the expected length of the codewords is minimized.

An optimum set of codewords is obtained by Huffman's algorithm. More particularly, let $a_i$ be a source symbol that occurs with probability $p_i$. The algorithm associates $a_i$ with a binary codeword $c_i$ of length $l_i$ such that $2^{-l_i} \approx p_i$. The algorithm guarantees that $$\sum_{i=0}^{M-1} 2^{-l_i} = 1$$

(Kraft's inequality is satisfied with equality), and that the expected value of the codeword length, $$L = \sum_{i=0}^{M-1} p_i \ell_i,$$

approaches the entropy of the source symbols within one bit [10]:

$$H(p) \le L \le H(p)+1. \qquad (8)$$

In the limit for large H(p), the concatenated Huffman codewords yield a binary sequence of independent and equiprobable zeroes and ones with rate R=L≅H(p) bit per source symbol. However, for certain probability distributions L may be closer to H(p)+1 than H(p) because of quantization effects inherent in the code construction. If H(p) is small, the difference between L and H(p) can be significant. The rate efficiency may be improved by constructing a Huffman code for blocks of K>1 source symbols. Then, (8) takes the form H(p)≦L(K)/K=L≦H(p)+1/K , where L(K) is the expected length of the Huffman codewords associated with K-symbol blocks. The code comprises $M^K$ codewords and the rate expressed in bit per source symbol will generally be within 1/K bit from H(p).

With the Huffman shaping method of the present invention, the traditional encoding approach is reversed. A Huffman code is generated for the optimum probability distribution $\tilde{p}$ of the modulation symbols in a given M-ary constellation. In the transmitter, the sequence of data bits is suitably scrambled so that perfect randomness can be assumed. The scrambled sequence is buffered and segmented into Huffman codewords, as in traditional Huffman decoding. A codeword $c_i$ is encountered with probability $2^{-\ell_i} \approx \tilde{p}_i$ and mapped into modulation symbol $a_i$. In the receiver, when a symbol $a_i$ is detected codeword $c_i$ is inserted into the binary output stream.

For the general case of K-dimensional modulation (K=1: PAM, K=2: QAM), it is appropriate to express rates and symbol energies per dimension, while $a_i$, $\tilde{p}_i$, and $l_i$ relate to K-dimensional symbols.

The mean value $\overline{R}^h$ and the standard deviation $\sigma_R^h$ of the number of bits encoded per symbol dimension become $$R^h = \frac{1}{K} \sum_{i=0}^{M-1} 2^{-\ell_i} \ell_i \text{ bit/dimension} \left( \approx \frac{1}{K} H(\tilde{p}) \right), \qquad (9)$$

$$\sigma_R^h = \sqrt{\frac{1}{K} \sum_{i=0}^{M-1} 2^{-\ell_i} (\ell_i - KR^h)^2} . \qquad (10)$$

The average symbol energy per dimension $S^h$ and the shaping gain $G_s^h$ of the Huffman-shaped symbol sequence are given by $$S^h = \frac{1}{K} \sum_{i=0}^{M-1} 2^{-\ell_i} |a_i|^2 \text{ energy per dimension} \left( \approx \frac{1}{K} E(\tilde{p}) \right), \qquad (11)$$

$$G_s^h = \frac{2^{2R^h} - 1}{3 \times E^h}. \qquad (12)$$

The corresponding quantities obtained with optimum shaping probabilities $\tilde{p}$ will be denoted, respectively, by $\tilde{R}$ and $\sigma_{\tilde{R}}$ (bit/dimension), $\tilde{S}$ (energy per dimension), and $\tilde{G}_s$ (optimum shaping gain).

For numerical evaluations, uncoded modulation with M-PAM (M=2 m) and M-QAM (M=4 m) constellations have been considered. The M-QAM constellations are either square constellations M-QAM$_{sq}$=√M-PAM×√M-PAM, or lowest-energy constellations M-QAM$_{le}$ comprising the M points in the set {(1+2i,1+2k), i, k ∈Z} nearest to the origin. The symmetries of the symbol constellations are enforced on the Huffman codes. In the PAM case, m codewords are constructed for positive symbols and then extended by a sign bit. Similarly, in the QAM case m codewords are constructed for symbols in the first quadrant and extended by two quadrant bits. The results of different numerical evaluations are depicted in FIGS. 3, 4, and 5.

Figure 3:
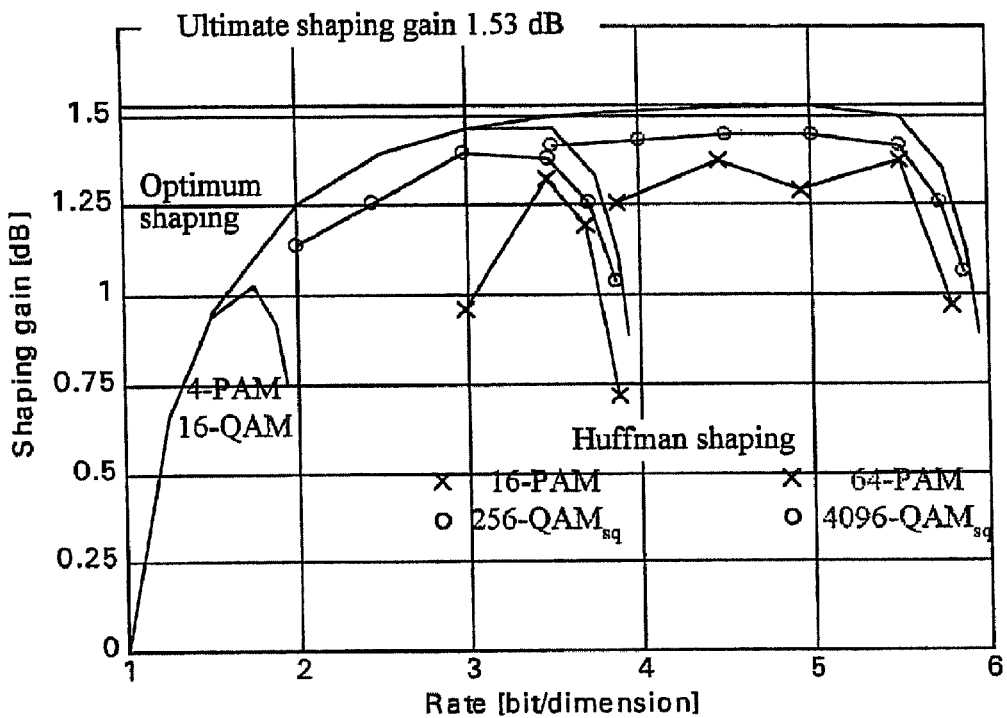
FIG. 3 shows shaping gain versus rate for PAM and $QAM_{sq}$ constellations of different sizes, in accordance with the present invention.
Figure 3:
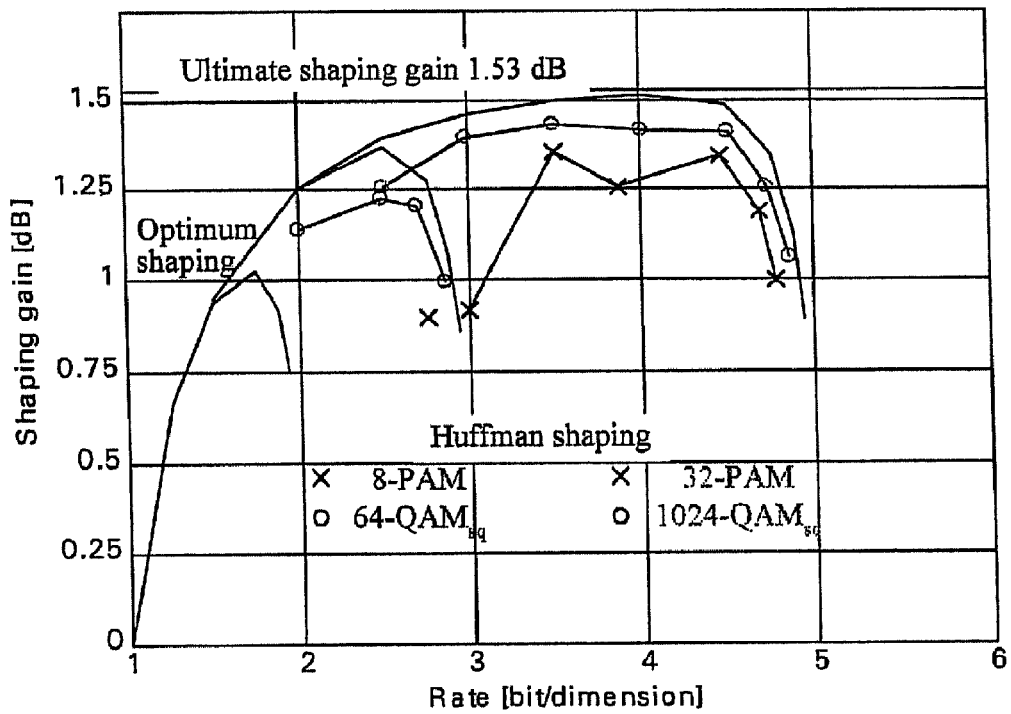

FIG. 3 shows shaping gain versus rate for PAM and QAM$_{sq}$ constellations of different sizes, in accordance with the present invention. The solid curves indicate the shaping gains obtained with the optimum shaping probabilities $\tilde{p}$. Every rate in the interval 1≦R≦log$_2$(M)/K can be accomplished (bit per dimension). The shaping gains vanish at R=1 (constellations reduced to BPSK or QPSK) and R=log$_2$(M)/K (equiprobable M-QAM). The optimum shaping gains practically reach the ultimate shaping gain of 1.53 dB at R=4 bit per dimension for ≧32-PAM and ≧1024-QAM$_{sq}$ constellations. With the Huffman shaping method of the present invention, not every rate can be realized because of quantization effects in the construction of Huffman codes. For PAM, shaping gains of up to ≈1.35 dB are achieved at some rates above 3 bit per dimension. The effects of quantization are significantly reduced in the QAM cases. With ≧256-QAM$_{sq}$ constellations shaping gains within 0.1 dB from the ultimate shaping gain of 1.53 dB are consistently obtained at rates above 3 bit per dimension.

Figure 4:
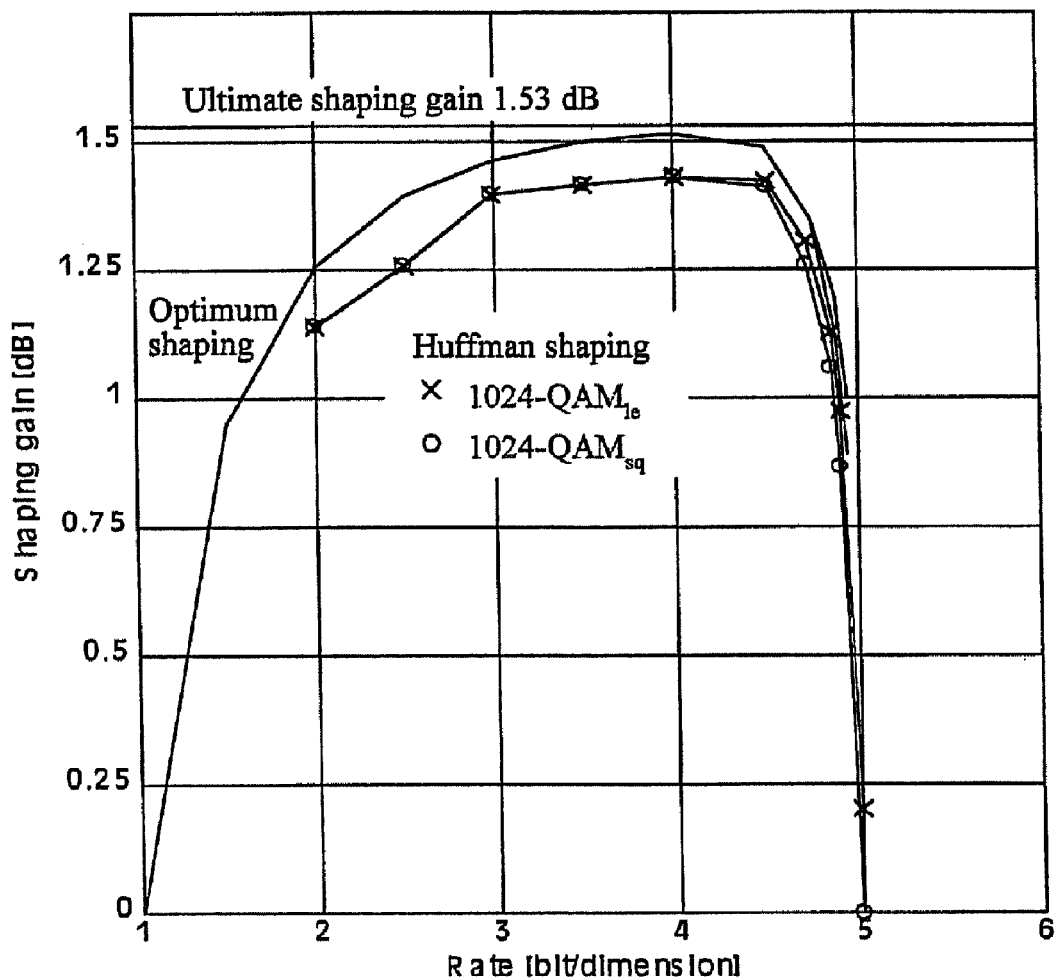
FIG. 4 plots shaping gains versus rate for square and lowest-energy 1024-QAM constellations, in accordance with the present invention.

FIG. 4 plots shaping gains versus rate for square and lowest-energy 1024-QAM constellations, in accordance with the present invention. Minor differences occur in the region of diminishing shaping gains, at rates above 4.5 bit/dimension. The shaping gain of equiprobable 1024-QAM$_{le}$ (R=5 bit/dimension) is 0.2 dB.

Figure 5:
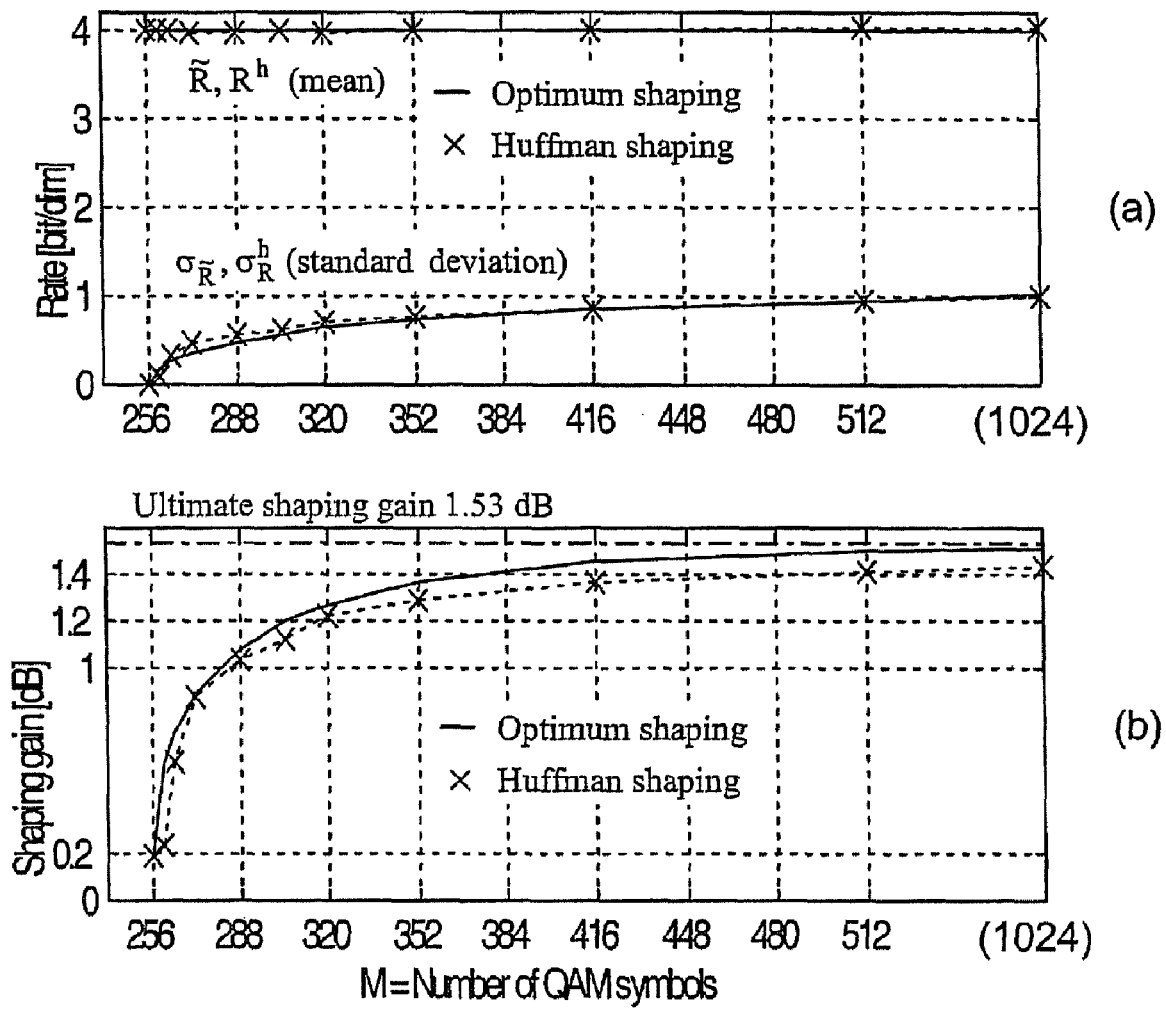
FIG. 5 depicts the mean and standard deviation of the rate in bit/dimension and the shaping gain accomplished for a nominal rate of R=4 bit/dimension with $QAM_{le}$ constellations of different sizes, in accordance with the present invention.

FIG. 5 depicts the mean and standard deviation of the rate in bit/dimension and the shaping gain accomplished for a nominal rate of R=4 bit/dimension with QAM$_{le}$ constellations of different sizes, in accordance with the present invention. The nominal rate is at least closely achieved with Huffman shaping (with optimum shaping it is exactly achieved). The standard deviation increases with increasing constellation size to a final value of ≈1 bit/dimension. The optimum shaping gain and the Huffman shaping gain increase rapidly when the initial 256-QAM constellation is enlarged. The respective final shaping gains of ≈1.5 dB and ≈1.4 dB are practically achieved with M=512 (512-QAM$_{le}$: 1.495 dB and 1.412 dB, 1024-QAM$_{le}$: 1.516 dB and 1.432 dB).

Figure 6:
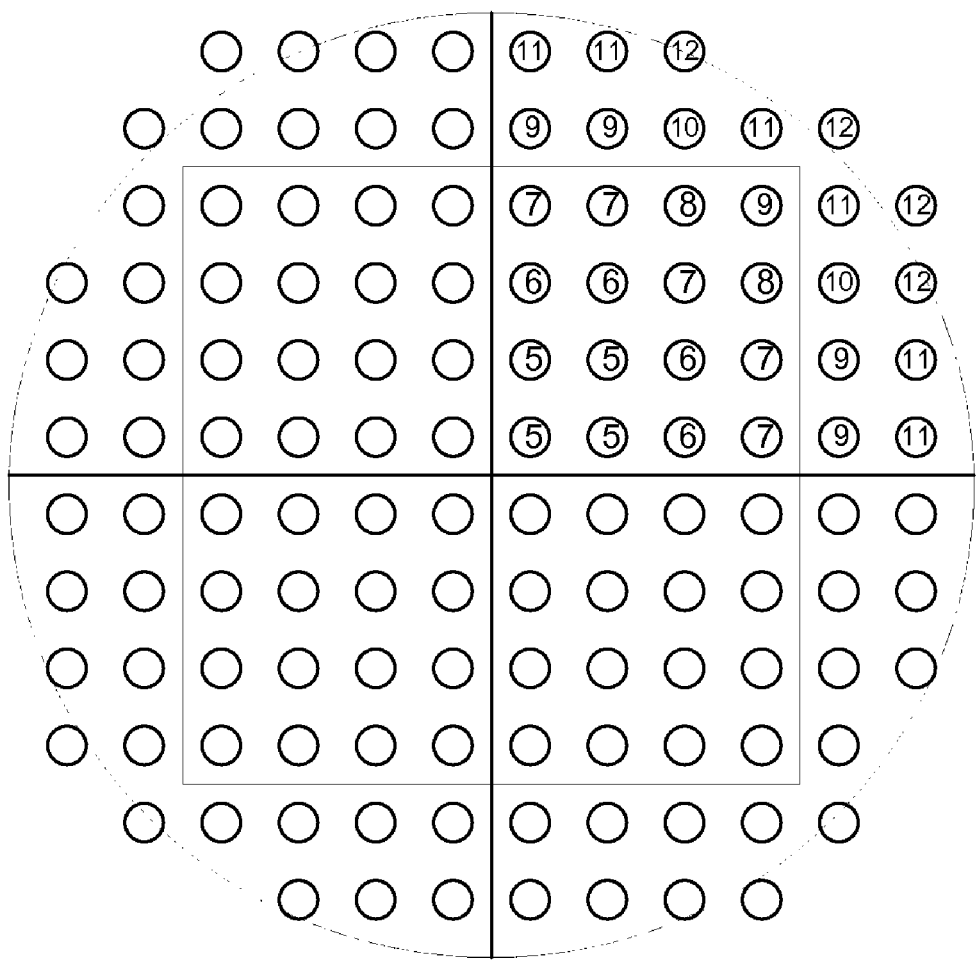
FIG. 6 illustrates a 128-$QAM_{le}$ constellation with Huffman shaping for a nominal rate of 3 bit/dimension, in accordance with the present invention.

FIG. 6 illustrates a 128-QAM$_{le}$ constellation with Huffman shaping for a nominal rate of 3 bit/dimension, in accordance with the present invention. The codeword lengths ranging from 5 to 12 bits are indicated for the first-quadrant symbols. $\overline{R}^h$=2.975 ($\sigma_R^h$=0.919) bit/dimension and $G_s^h$=1.378 dB ($\tilde{G}_s$=1.443 dB) are achieved. The symbol energies, optimum shaping probabilities, codeword probabilities and lengths, and the codewords of the first quadrant symbols are listed below. The codewords for the first-quadrant symbols end with 00.

TABLE 1

Huffman code words tabulated against their index

| i | $|a_i|^2$ | $\tilde{p}_i$ | $p_i^h = 2^{-l_i}$ | $l_i$ | $c_i$ |
|---|---|---|---|---|---|
| 0 | 2 | 0.03872 | 0.03125 | 5 | 00000 |
| 1 | 10 | 0.02991 | 0.03125 | 5 | 10000 |
| 2 | 10 | 0.02991 | 0.03125 | 5 | 01100 |
| 3 | 18 | 0.02311 | 0.03125 | 5 | 11100 |
| 4 | 26 | 0.01785 | 0.01563 | 6 | 010000 |
| 5 | 26 | 0.01785 | 0.01563 | 6 | 001100 |
| 6 | 34 | 0.01379 | 0.01563 | 6 | 110000 |
| 7 | 34 | 0.01379 | 0.01563 | 6 | 101100 |
| 8 | 50 | 0.00823 | 0.00781 | 7 | 1010000 |
| 9 | 50 | 0.00823 | 0.00781 | 7 | 0101100 |
| 10 | 50 | 0.00823 | 0.00781 | 7 | 0101000 |
| 11 | 58 | 0.00636 | 0.00781 | 7 | 1101100 |
| 12 | 58 | 0.00636 | 0.00781 | 7 | 1101000 |
| 13 | 74 | 0.00379 | 0.00391 | 8 | 10101100 |
| 14 | 74 | 0.00379 | 0.00391 | 8 | 10101000 |
| 15 | 82 | 0.00293 | 0.00195 | 9 | 001001000 |
| 16 | 82 | 0.00293 | 0.00195 | 9 | 001000100 |
| 17 | 90 | 0.00226 | 0.00195 | 9 | 001010100 |
| 18 | 90 | 0.00226 | 0.00195 | 9 | 001010000 |
| 19 | 98 | 0.00175 | 0.00195 | 9 | 001011100 |
| 20 | 106 | 0.00135 | 0.00098 | 10 | 0010011100 |
| 21 | 106 | 0.00135 | 0.00098 | 10 | 0010011000 |
| 22 | 122 | 0.00081 | 0.00049 | 11 | 00100000100 |
| 23 | 122 | 0.00081 | 0.00049 | 11 | 00100000000 |
| 24 | 130 | 0.00062 | 0.00049 | 11 | 00101101000 |
| 25 | 130 | 0.00062 | 0.00049 | 11 | 00101100100 |
| 26 | 130 | 0.00062 | 0.00049 | 11 | 00101100000 |
| 27 | 130 | 0.00062 | 0.00049 | 11 | 00100001100 |
| 28 | 146 | 0.00037 | 0.00024 | 12 | 001000010100 |
| 29 | 146 | 0.00037 | 0.00024 | 12 | 001000010000 |
| 30 | 162 | 0.00022 | 0.00024 | 12 | 001011011000 |
| 31 | 170 | 0.00017 | 0.00024 | 12 | 001011011100 |

Figure 7:
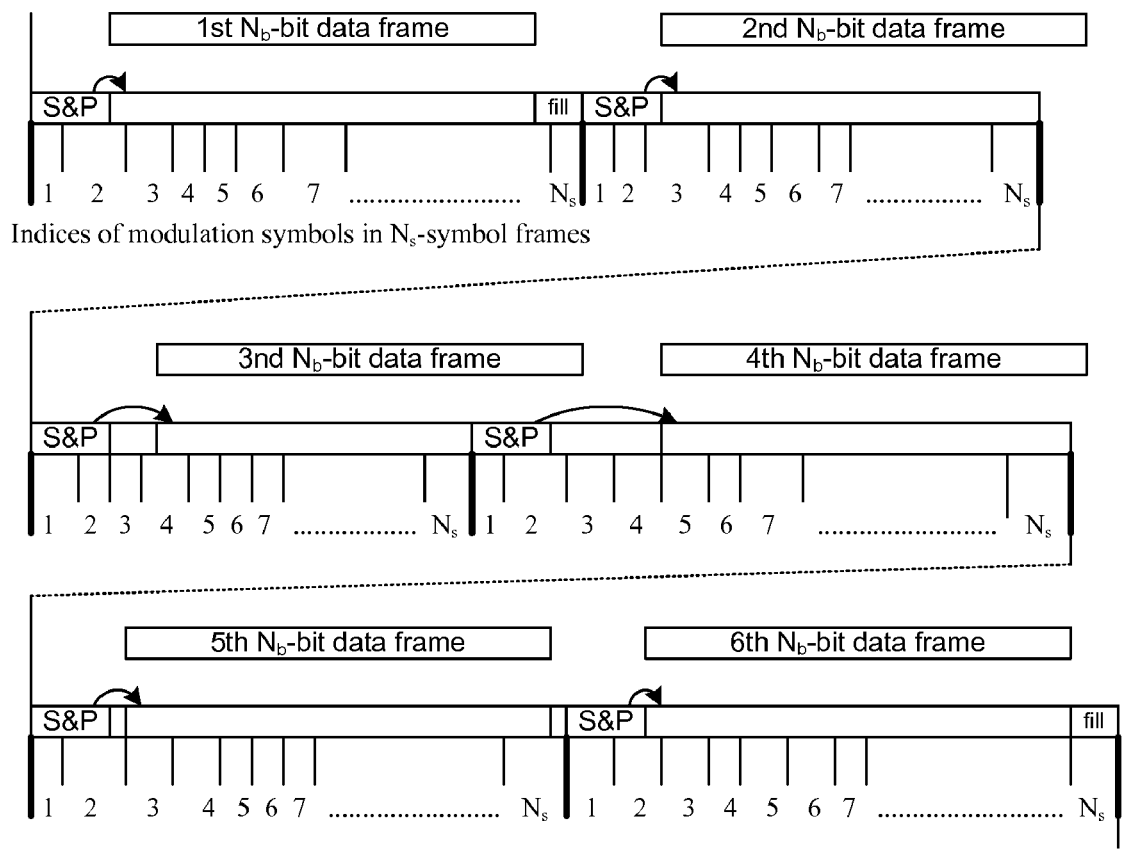
FIG. 7 illustrates one embodiment of a generic method for achieving constant rate and recovering from bit insertions and deletions.

FIG. 7 illustrates one embodiment of a generic method for achieving constant rate and recovering from bit insertions and deletions. Data frames of $N_b$ bits are embedded into symbol frames of $N_s$ modulation symbols. Every sequence of bits transmitted within a symbol frame begins with a S&P (synch & pointer) field of $n_{sp}=n_s+n_p$ bits, where $n_s$ is the width of a synch subfield and $n_p$ is the width of a pointer subfield. The synch subfield enables the receiver to acquire symbol-frame synchronization. In principle, sending a known pseudo-random binary sequence with one bit ($n_s=1$) in every S&P field is sufficient (as in T1 systems). The pointer subfield of the $n^{th}$ symbol frame expresses the offset in bits of the $n^{th}$ data frame from the S&P field.

With reference to FIG. 7, in the $1^{st}$ symbol frame, the $1^{st}$ data frame follows the S&P field with zero offset. The S&P field and $1^{st}$ data frame are parsed into Huffman codewords, which are then mapped into modulation symbols indexed by 1, 2, 3, . . . $N_s$. The end of the $1^{st}$ data frame is reached before the $N_s^{th}$ modulation symbol has been determined. The data frame is padded with fill bits until the $N_s^{th}$ modulation symbol is obtained. The $2^{nd}$ data frame follows the S&P field of the $2^{nd}$ symbol frame again with zero offset. Now the last symbol of the $2^{nd}$ symbol frame is found before the $2^{nd}$ data frame is completely encoded. The S&P field of the $3^{rd}$ symbol frame is inserted and encoding of the remaining part of the $2^{nd}$ data frame is then continued, followed by encoding the $3^{rd}$ data frame. The pointer in the S&P field indicates the offset of the $3^{rd}$ data frame from the S&P field. The $3^{rd}$ data frame can again not completely be encoded in the $3^{rd}$ symbol frame. The $4^{th}$ data frame becomes completely encoded in the $4^{th}$ symbol frame and is padded with fill bits, and so on. The pointer information in the S&P fields enables a receiver to recover from bit insertion and deletion errors.

To determine the overhead in framing bits per symbol, first let $B_n$ be the number of bits that are encoded into the $N_s$ symbols of the $n^{th}$ symbol frame. As mentioned above, the mean and standard deviation of the number of bits encoded per symbol dimension are $R^h$ and $\sigma_R^h$, respectively, as given by (9) and (10). Then $B=N_s K R^h$ is the mean and $\sigma_B = \sqrt{N_s K} \sigma_R^h$ the standard deviation of $B_n$. For large $N_s$, the probability distribution of $B_n$ will accurately be approximated by the Gaussian distribution $$Pr(B_n = x) \cong \frac{1}{\sqrt{2\pi}\, \sigma_B} \exp\left(-\frac{(x-B)^2}{2\sigma_B^2}\right), \; x = 0, 1, 2, 3, \ldots \quad (13)$$

Next, let $P_n$ be the pointer value in the S&P field of the $n^{th}$ symbol frame. The pointer values will remain bounded if $B > n_{sp} + N_b$. Equivalently, the average number of fill bits per frame, $n_{fill}$, is nonzero:

$$n_{fill} = B - (n_{sp} + N_b) > 0. \quad (14)$$

Moreover, in a practical implementation the pointer values remain limited to the values that can be represented in the $n_p$-bit pointer subfield, i.e. $0 \leq P_n \leq 2^{n_p} - 1$. Parameters are chosen such that the probability of $P_n > 2^{n_p} 1$ becomes negligible. From FIG. 7, one can verify the recursive relation $$P_n = \begin{cases} 0 & \text{if } n_{sp} + P_{n-1} + N_b \leq B_{n-1} \\ n_{sp} + P_{n-1} + N_b - B_{n-1} & \text{otherwise.} \end{cases} \quad (15)$$

The temporal evolution of the pointer probabilities then becomes $$Pr(P_n = 0) = \sum_{x \geq 0} Pr(P_{n-1} = x) Pr(B_{n-1} \geq n_{sp} + N_b + x), \quad (16)$$

$$Pr(P_n = y) = \sum_{\substack{x \geq 0 \text{ and} \\ x \geq y - n_{sp} - N_b}} Pr(P_{n-1} = x) Pr(B_{n-1} = n_{sp} + N_b + x - y), \quad (17)$$

$$y = 1, 2, 3, \ldots .$$

(equation (17) changed to fit within page margins)

Figure 8:
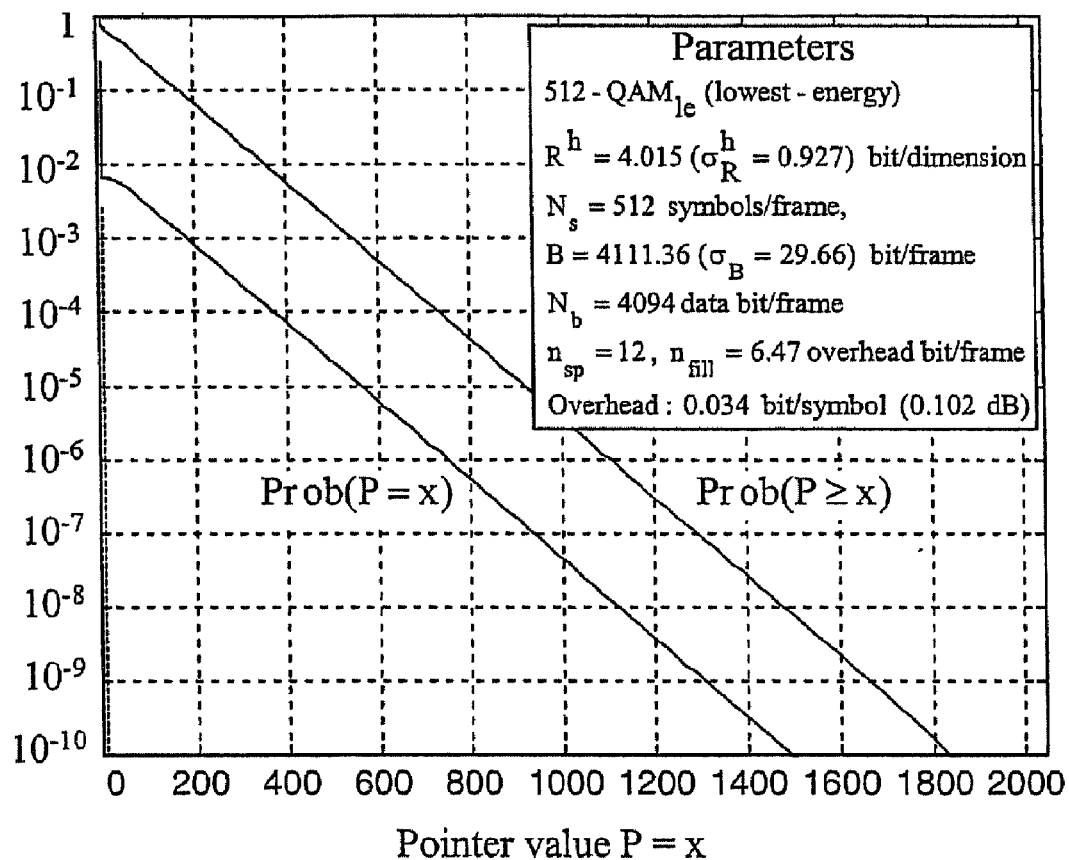
FIG. 8 illustrates the probability of pointer overflow as a function of framing buffer size in accordance with the present invention.

The steady-state distribution $Pr(P=x)=Pr(P_{n \to \infty}=x)$ can be determined numerically (mathematically speaking, $Pr(P=x)$ is the eigensolution of (16) and (17) associated with eigenvalue one). $Pr(P=x)$ and $Pr(P \geq x)$ are plotted in FIG. 8 for the following case.

Lowest-energy 512-QAM, nominal rate R=4 bit/dimension

Huffman code design:
⇒ $R^h$=4.015, $\sigma_R^h$=0.927 bit/dimension; shaping gain $G_s^h$=1.412 dB.

Assume $N_s$=512 QAM symbols/symbol, $N_b$=4094 bit/data frame, $n_{sp}$=12 ($n_s$=1, $n_p$=11)
⇒ B=4111.36, $\sigma_B$=29.66, $n_{fill}$=5.36 bit/symbol frame.

The pointer field allows for a maximum pointer value of 2047. FIG. 6 shows that $Pr(P>2047)$ is well below $10^{-10}$. The pointer values exhibit a Paré to distribution, i.e., $\log(Pr(P \geq x))$ decreases linearly for large x.

A framing overhead of $(n_{sp}+n_{fill})/N_s$=0.034 bit/QAM symbol is found, which is equivalent to an SNR penalty of 0.102 dB. The final net shaping gain becomes 1.412−0.102=1.310 dB.

Based on the above mathematical foundation of Huffman shaping, in one embodiment of the invention, the method of the present invention may generally comprise two parts. The first is related to the design of the Huffman code to be employed on a given channel, and the second is related to the operation of the Huffman shaper in the transmitter. While the above mathematical foundation of Huffman shaping assumes a PAM implementation; extension to higher-dimensional modulation are also possible.

Figure 9:
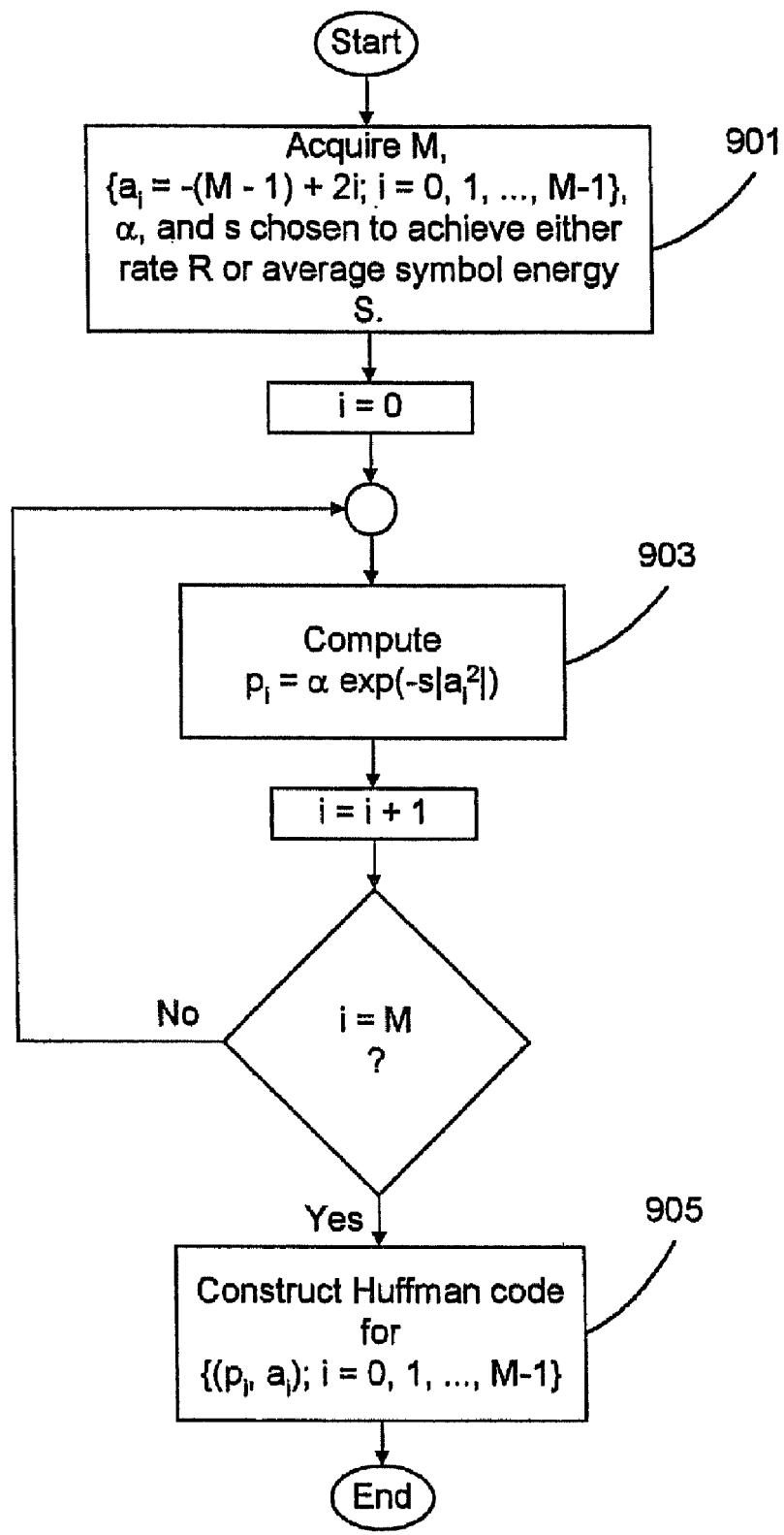
FIG. 9 illustrates one embodiment of the design of a Huffman code in accordance with the present invention.

FIG. 9 illustrates one embodiment of the design of a Huffman code in accordance with the present invention. The modulation scheme is characterized by parameters M, $\alpha$, and s (see (7) and accompanying text above) acquired in block 901, from which are derived the constellation levels $\{a_i; i=0, 1, \ldots, M-1\}$ also in block 901. The probability $p_i$ is then calculated for each $a_i$ in step 903 for $i=0, 1, \ldots, M-1$. Finally, a Huffman code for the symbols $\{a_i\}$ and their corresponding probabilities $\{p_i\}$ is constructed in block 905.

Figure 10:
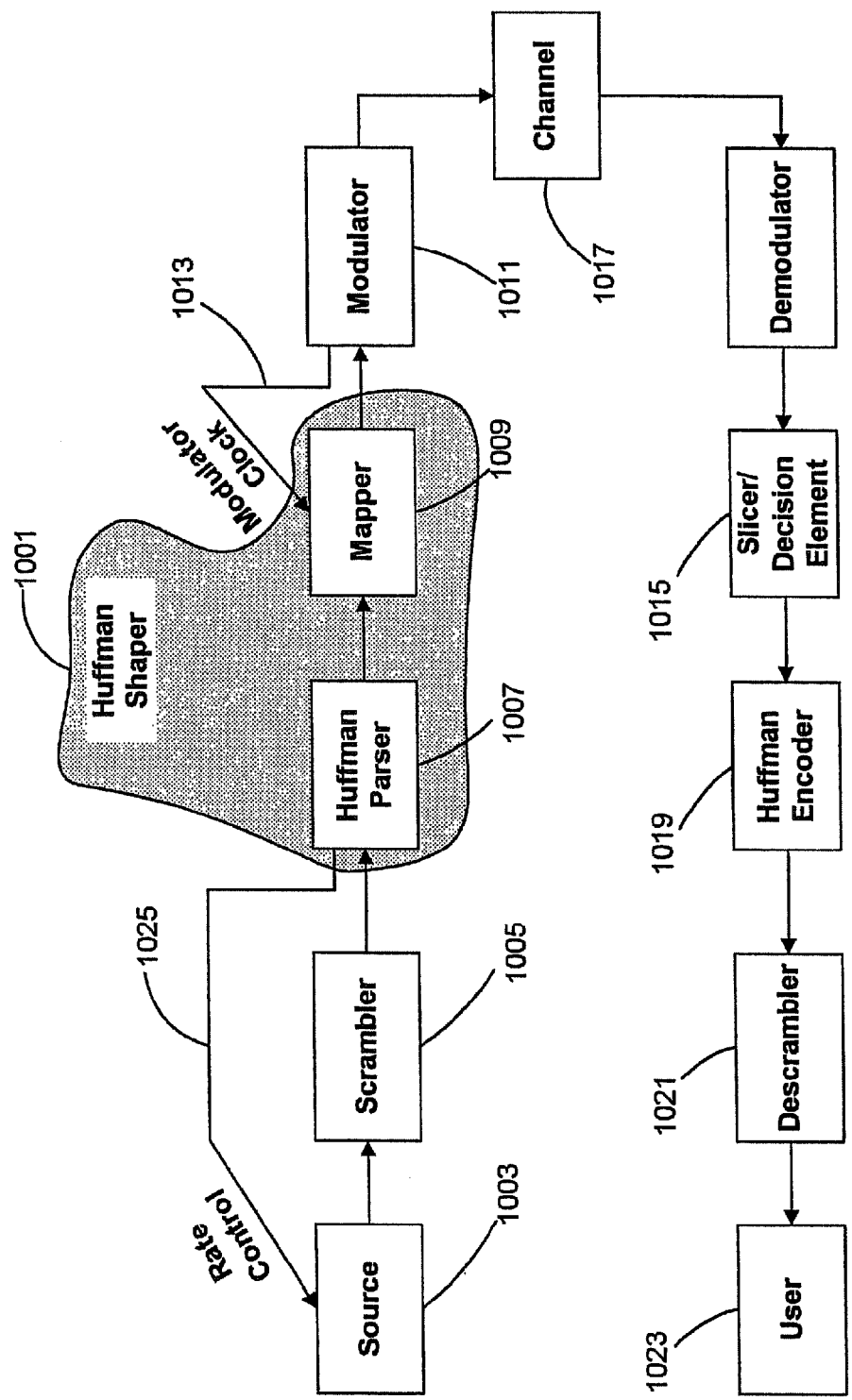
FIG. 10 is a block diagram of one embodiment of a communication system that operates in accordance with the method of present invention.

FIG. 10 is a block diagram of one embodiment of a communication system that operates in accordance with the method of present invention. Upon completion of the construction of the Huffman code in FIG. 9, a Huffman shaper is employed. Referring to FIG. 10, Huffman shaper 1001 is loaded with information from a table similar to Table 1 above. The Huffman shaper information comprises one entry for each valid Huffman codeword and a corresponding entry for the channel symbol into which that Huffman codeword is mapped. The information is also sent to the receiver, using means available in the training procedure for the system. Then Huffman shaping proceeds during data transmission.

Specifically, referring again to FIG. 10, data source 1003 generates (typically binary, but this is not required) data symbols at an adjustable rate controlled by the Huffman shaper 1001. The data symbols are converted to pseudo-random form in a scrambler 1005. The Huffman shaper 1001 generally comprises two parts, namely, a Huffman parser 1007 and a mapper 1009. The Huffman parser 1007 accumulates outputs from the scrambler 1005, symbol by symbol (e.g., bit by bit), until it accumulates a valid Huffman codeword. This codeword forms the input to the mapper 1009. The mapper 1009 generates the channel symbol that corresponds to the Huffman codeword and passes the channel symbol to modulator 1011, under the control of the modulator clock 1013. The modulator clock 1013 defines the timing of the system. If required by the modulator clock 1013, the Huffman shaper 1001 controls the rate at which it accumulates output symbols from the scrambler 1005, in order to meet the demands of the modulator clock 1013.

Slicer/decision element 1015 maps the symbol received from the channel 1017 into its best estimate of the channel symbol transmitted by the remote transmitter. The Huffman encoder 1019 maps the estimated received channel symbol into a Huffman codeword, which is passed to the descrambler 1021. The descrambler 1021 inverts the operation of the scrambler 1005, and the resulting received sequence of data symbols is passed to the user 1023.

The Huffman shaper 1001 is modeled as being able to control the rate at which data are input to the shaper (see reference numeral 1025 of FIG. 10). More colloquially, present-day communication systems often operate in an environment where a large buffer of data are available for transmission, and data can be removed from that buffer at any rate appropriate for the transmission medium. Therefore, ascribing an adjustable rate capability to the Huffman shaper 1001 does not burden the method of the present invention with functionality that is not already present in practical situations.

As described above, a system that employs Huffman shaping carries a variable number of bits per modulation symbol. Therefore channel errors can introduce data in the receiver that is incorrect bit-by-bit, and that actually may contain the wrong number of bits as well. That is, referring to FIG. 10, if a channel symbol different from the one introduced at the input to the modulator 1011 is received at the output of the slicer/decision element 1015, then both the bits and the number of bits passed to the Huffman encoder 1019 may be incorrect. To compensate for this potential effect, a framer/deframer may be introduced.

Figure 11:
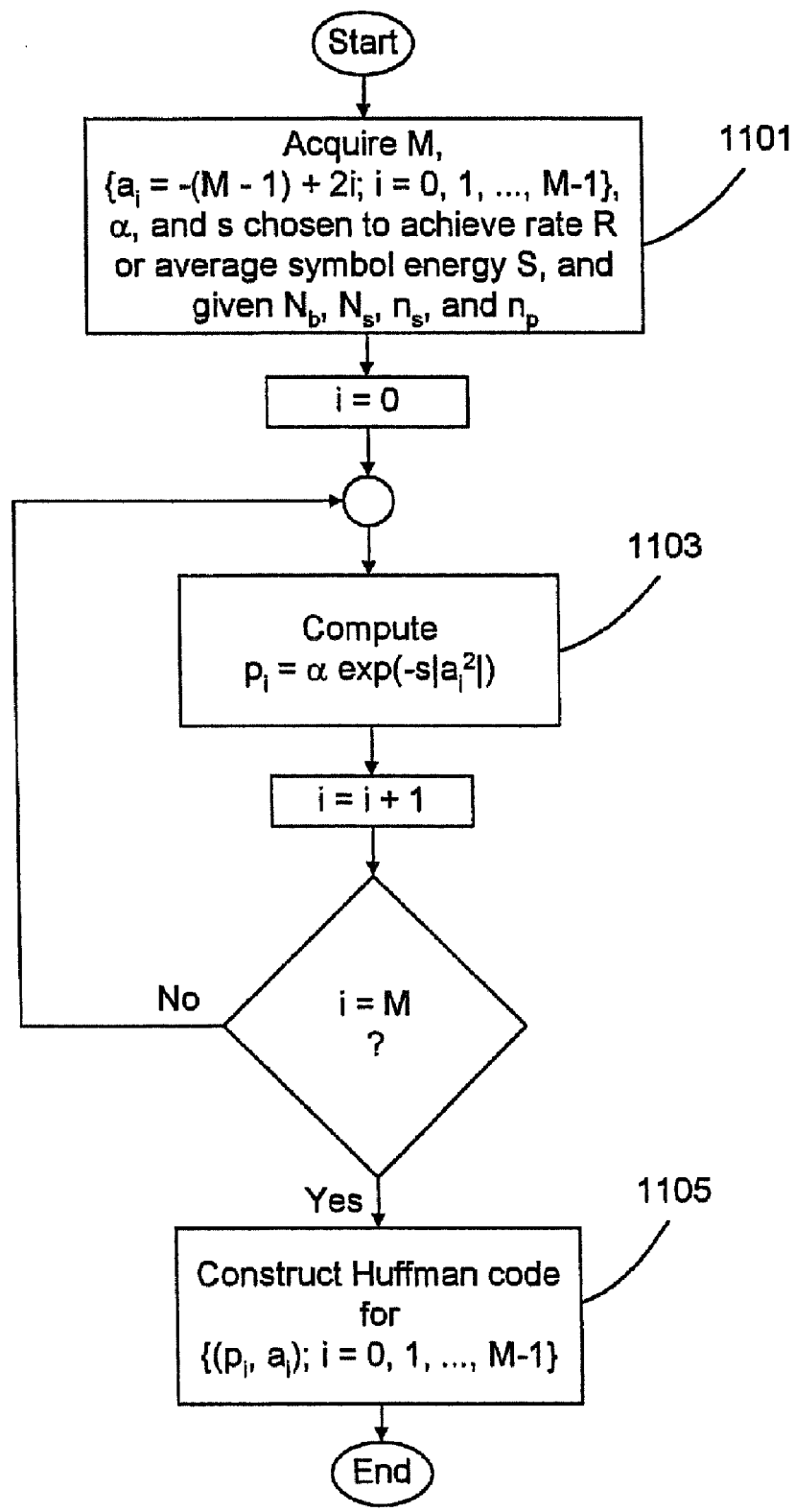
FIG. 11 is another embodiment of the design of a Huffman code in accordance with the present invention, when a framer/deframer is utilized.

FIG. 11 is another embodiment of the design of a Huffman code in accordance with the present invention, when a framer/deframer is utilized. Again, a PAM implementation is assumed, but extensions to higher-dimensional modulation are also possible. Referring to FIG. 11, the modulation scheme is characterized by parameters M, $\alpha$, s, $N_b$, $N_s$, $n_s$, and $n_p$ acquired in block 1001, from which are derived the constellation levels $\{a_i; i=0, 1, \ldots, M-1\}$ (block 1101). Parameters $N_b$, $N_s$, $n_s$, and $n_p$ define, respectively, the number of data bits, the number of modulation symbols, the number of synch bits, and the number of pointer bits in each symbol frame. The probability $p_i$ then is calculated for each $a_i$ in block 1103 for $i=0, 1, \ldots, M-1$. Finally, a Huffman code for the symbols $\{a_i\}$ and their corresponding probabilities $\{p_i\}$ is constructed in block 1105.

Figure 12:
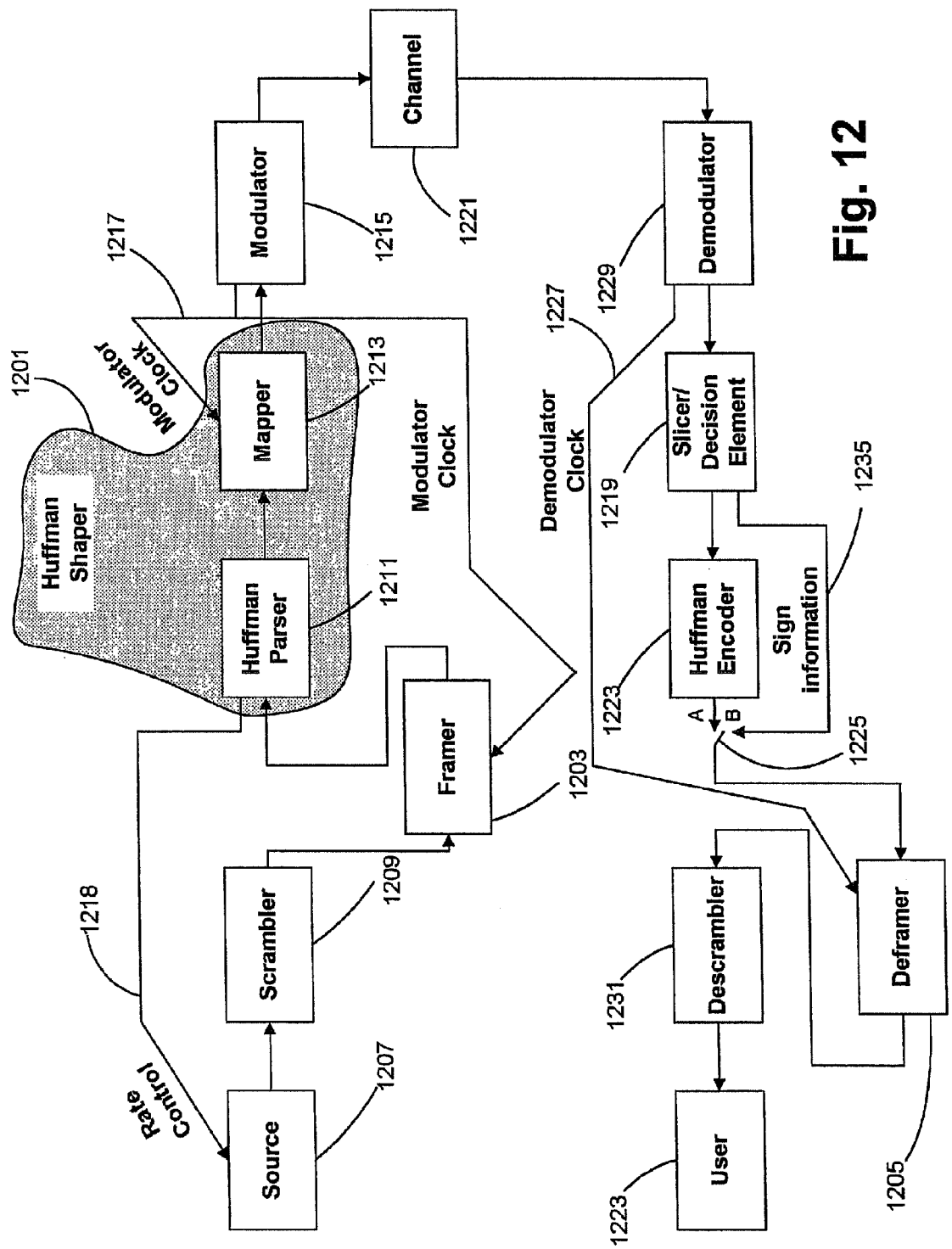
FIG. 12 is a block diagram of another embodiment of a communication system that operates in accordance with the method of present invention, utilizing a framer/deframer.

FIG. 12 is a block diagram of another embodiment of a communication system that operates in accordance with the method of present invention, utilizing a framer/deframer. Upon completion of the construction of the Huffman code in FIG. 11, a Huffman shaper is employed. Referring to FIG. 12, Huffman shaper 1201 is loaded with information from a table similar to Table 1 above. The Huffman shaper information consists of one entry for each valid Huffman codeword and a corresponding entry for the channel symbol into which that Huffman codeword is mapped. A framer 1203 is loaded with parameters $N_b$, $N_s$, $n_s$, and $n_p$. The information is also sent to the receiver using means available in the training procedure for the system. In the receiver a deframer 1205 is loaded with the same parameters, $N_b$, $N_s$, $n_s$, and $n_p$. Then Huffman shaping proceeds during data transmission.

Specifically, referring to FIG. 12, data source 1207 generates data symbols at an adjustable rate controlled by the Huffman shaper 1201. The data symbols are converted to pseudo-random form in a scrambler 1209. The scrambler 1209 output is collected in the framer 1203, which arranges transmitted data in groups of $N_b$ bits per symbol frame, $N_s$ modulation symbols per symbol frame, $n_s$ synch bits per frame and $n_p$ pointer bits per frame as discussed above. The Huffman shaper 1201 generally comprises of two parts, a Huffman parser 1211 and the mapper 1213. The Huffman parser 1211 accumulates outputs from the framer 1203, symbol by symbol, until it accumulates a valid Huffman codeword. This codeword forms the input to the mapper 1213. The mapper 1213 generates the channel symbol that corresponds to the Huffman codeword and passes the channel symbol to the modulator 1215 under the control of the modulator clock 1217. The modulator clock 1217 defines the timing of the system. If required by the modulator clock 1217, the Huffman shaper 1201 controls the rate at which it accumulates output symbols from the scrambler 1209 in order to meet the demands of the modulator clock 1217 (see reference numeral 1218 in FIG. 12).

The slicer/decision element 1219 maps the symbol received from the channel 1221 into its best estimate of the channel symbol transmitted by the remote transmitter. The Huffman encoder 1223 maps the estimated received channel symbol into a Huffman codeword. In this embodiment, switch 1225 is in position A. The deframer 1205 is able to distinguish individual received modulation symbols by means of the demodulator clock 1227 signal from the demodulator 1229. It uses the received symbol frame as well as the synch and pointer bits to construct a serial data stream corresponding to the output of the scrambler 1209. This output is passed to the descrambler 1231, which inverts the operation of the scrambler 1209, and the resulting received sequence of data symbols is passed to the user 1233.

In still another embodiment of the invention, the Huffman code constructed in a slightly modified fashion. This embodiment uses a one-dimensional form of the Huffman code described above. Specifically, a Huffman code is constructed for only the positive modulation symbols. After a Huffman code word has been collected in the transmitter by the Huffman decoder, the decoder uses its next input bit to define the sign of the modulation symbol corresponding to the collected Huffman code word. An inverse procedure is applied in the receiver. Again, a PAM implementation is assumed, but extension to higher-dimensional modulation is also possible.

Referring to FIG. 11, the modulation scheme is characterized by parameters M, $\alpha$, s, $N_b$, $N_s$, $n_s$, and $n_p$ acquired in block 1101, from which are derived the constellation levels $\{a_i; i=0, 1, \ldots, M-1\}$ (block 1101). Parameters $N_b$, $N_s$, $n_s$, and $n_p$ define, respectively, the number of data bits, the number of modulation symbols, the number of synch bits, and the number of pointer bits in each symbol frame. The probability $p_i$ is then calculated for each nonnegative $a_i$ in block 1103 for i=0, 1, . . . , M-1. Finally, a Huffman code for the nonnegative symbols $\{a_i\}$ and their corresponding probabilities $\{p_i\}$ is constructed in block 1105.

Upon completion of the construction of the Huffman code in FIG. 11, a Huffman shaper is employed. Referring to FIG. 12, Huffman shaper 1201 is loaded with information from a table similar to Table 1 above. The Huffman shaper information consists of one entry for each valid Huffman codeword and a corresponding entry for the channel symbol into which that Huffman codeword is mapped. The framer 1203 is loaded with parameters $N_b$, $N_s$, $n_s$, and $n_p$. The information is also sent to the receiver using means available in the training procedure for the system. In the receiver the deframer 1205 is loaded with the same parameters, $N_b$, $N_s$, $n_s$, and $n_p$. Then Huffman shaping proceeds during data transmission.

Specifically, data source 1207 generates data symbols at an adjustable rate controlled by the Huffman shaper 1201. The data symbols are converted to pseudo-random form in scrambler 1209. The scrambler 1209 output is collected in the framer 1203, which arranges transmitted data in groups of $N_b$ bits per symbol frame, $N_s$ modulation symbols per symbol frame, $n_s$ synch bits per frame and $n_p$ pointer bits per frame, as discussed above. The Huffman shaper 1201 generally comprises two parts, the Huffman parser 1211 and the mapper 1213. The Huffman parser 1211 accumulates outputs from the framer 1203, symbol by symbol, until it accumulates a valid Huffman codeword. The Huffman parser 1211 then accumulates one additional input bit and appends it to the Huffman codeword. This Huffman codeword with the appended bit forms the input to the mapper 1213. The mapper 1213 generates the channel symbol that corresponds to the Huffman codeword, and uses the appended bit to define the sign of the channel symbol. It then passes the channel symbol to the modulator 1215 under the control of the modulator clock 1217.

The slicer/decision element 1219 maps the magnitude of the symbol received from the channel 1221 into its best estimate of the magnitude of the channel symbol transmitted by the remote transmitter. It also estimates the sign of the received symbol. The channel symbol magnitude is passed to the Huffman encoder 1223, which maps the estimated received channel symbol magnitude into a Huffman code-word and presents the output at the A input of switch 1225. The sign of the received symbol is presented at the B input of switch 1225 by means of connection sign information 1235. Switch 1225, normally in the A position; is switched to the B position after each received Huffman code word, in order to accept the sign information 1235 from the slicer/decision element 1219. The deframer 1205 is able to distinguish individual received modulation symbols by means of the demodulator clock 1227 signal from the demodulator 1229. It uses the received symbol frame as well as the synch and pointer bits to construct a serial data stream corresponding to the output of the scrambler 1209. This output is passed to the descrambler 1231, which inverts the operation of the scrambler 1209, and the resulting received sequence of data symbols is passed to the user 1233.

Figure 13:
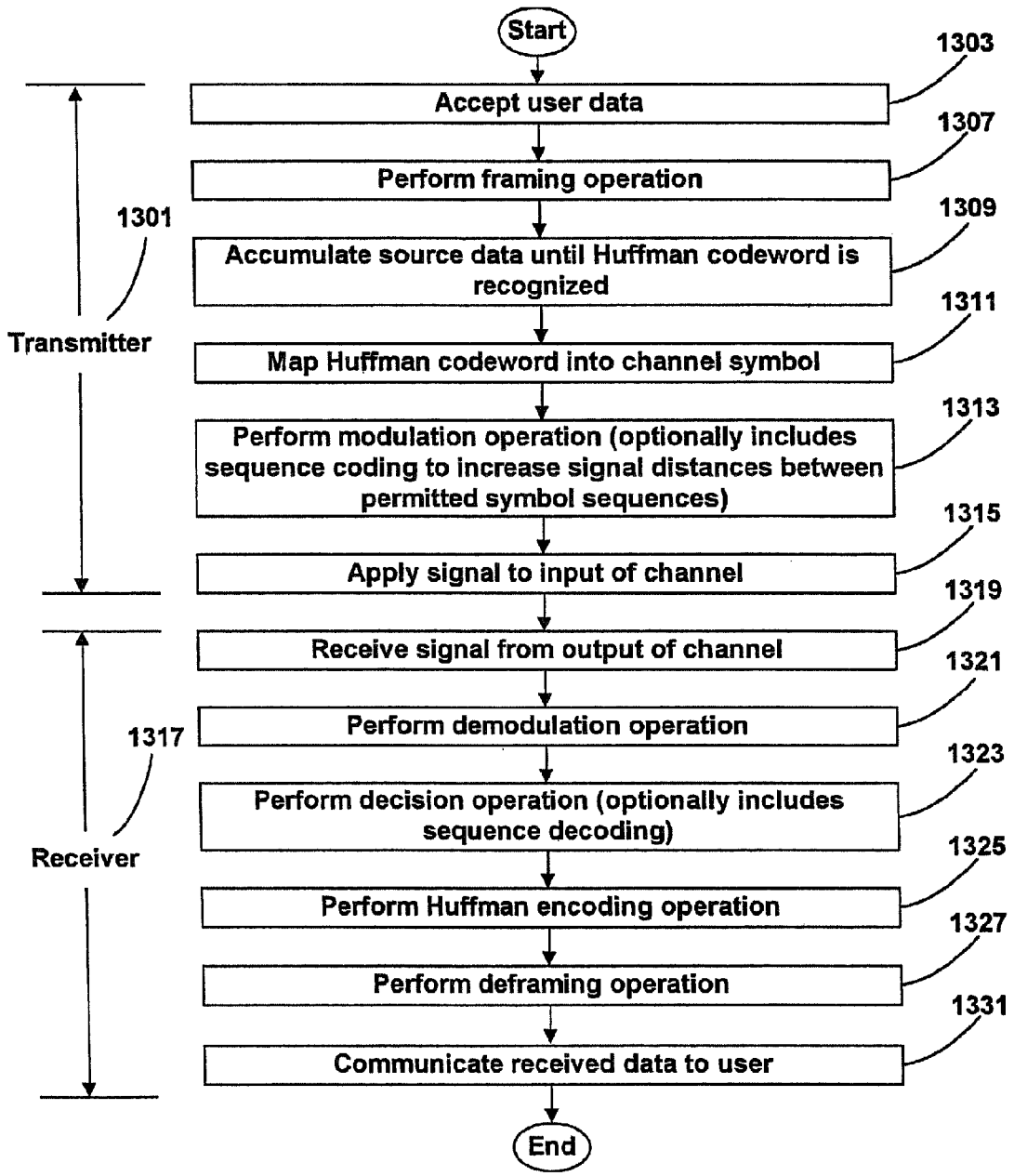
FIG. 13 illustrates one operation of a system that employs Huffman shaping in accordance with the present invention.

FIG. 13 illustrates one operation of a system that employs Huffman shaping in accordance with the present invention. A transmitter 1301 accepts user data (block 1303). The transmitter 1301 may also perform a framing operation (1307) to provide a means to recover from possible errors that may be introduced in the channel.

The transmitter 1301 then implements Huffman shaping. Specifically, the transmitter 1301 accumulates source data until a Huffman codeword is recognized (block 1309), and then maps the resulting Huffman codeword into a channel symbol (block 1311). The transmitter then performs a modulation operation (block 1313), which optionally includes sequence coding to increase the signal distances between permitted symbol sequences. Finally, the modulated signal is applied to the input of the communications channel (block 1315).

The receiver 1317 accepts the received signal from the channel output (block 1319), and demodulates it (block 1321). Demodulation generally includes such operations as timing tracking and equalization. The received signal is then subjected to a decision operation, which may optionally include sequence decoding (block 1323). The Huffman shaping (blocks 1309 and 1311) is inverted by applying the received signal to the input of a Huffman encoder (block 1325). The receiver 1317 then performs a deframing operation (block 1327), and communicates the received data to the user (block 1331).

Based on the foregoing discussion, it should be apparent that in one embodiment of the invention, once data is received from a data source, the sequence of binary data bits is randomized by a scrambling operation and bits are mapped into channel symbols such that the channel symbols occur with a probability distribution suitable for achieving shaping gain. This is accomplished by accumulating scrambled data bits until a Huffman codeword is recognized, at which time the Huffman codeword is mapped into a channel symbol. Then the channel symbol is applied to the input of a communication channel. The probability of recognizing in the scrambled data sequence a particular Huffman codeword of length L bits is $2^{-L}$. Hence, the channel symbol associated with that particular Huffman codeword will be transmitted with probability $2^{-L}$. Note that this channel encoding operation via Huffman codes corresponds in the field of source coding to Huffman decoding.

In one embodiment of the invention, the channel encoding operation described above is performed in combination with a framing operation to achieve transmission of data at a constant rate. In addition, channel symbols can be modulated in various ways before they are applied to the input of the communication channel.

Next, on the receiver side of the communication channel a channel symbol is obtained at the demodulator output. The channel symbol is converted into the corresponding Huffman codeword. The sequence of bits represented by concatenated Huffman codewords is descrambled and delivered to the data sink. The described channel decoding operation corresponds in the field of source coding to Huffman encoding.

In one embodiment of the invention, a deframing operation is performed, which provides for data delivery to the data sink at constant rate. In addition, the deframing operation limits the effect of channel demodulation errors, which can cause a temporal shift of the received binary data sequence. This shift can occur when a channel symbol is erroneously decoded whose associated Huffman codeword differs in length from the Huffman codeword associated with the correct channel symbol.

The method of the present invention results in a symbol constellation and a probability distribution of symbols in this constellation that exhibits a shaping gain of greater than 1 dB. The shaping gain may be, for example, 1.35 dB or 1.5 dB, depending on the specific design. More specifically, for PAM constellations, shaping gains of up to ≈1.35 dB are achieved for some rates. For QAM constellations, shaping gains within 0.1 dB from the ultimate shaping gain are consistently obtained for rates of >3 bit per dimension.

In general, a communication system according to the present invention comprises a communication node that performs a Huffman decoding operation to generate channel symbols with a desired probability distribution.

Many modifications and variations of the present invention are possible in light of the above teachings. Thus, it is to be understood that, within the scope of the appended claims, the invention may be practiced otherwise than as described hereinabove.

What is claimed and desired to be secured by Letters Patent is:

1. A communication system, comprising:
   a transmitter that includes a scrambler, a shaper and a modulator,
   wherein data is input into the transmitter,
   wherein the scrambler scrambles the inputted data,
   wherein the shaper accumulates the scrambled data,
   wherein the accumulated data forms Huffman codewords,
   wherein the shaper maps the formed Huffman codewords into channel symbols,
   wherein the channel symbols are passed to the modulator, and
   wherein the modulator transmits the channel symbols at a constant rate.

2. The communication system according to claim 1, wherein the scrambled data comprises pseudo-random data.

3. The communication system according to claim 1, wherein the transmitter performs channel coding operations to achieve coding gain in addition to gains attributable to the Huffman codewords.

4. The communication system according to claim 1, wherein the shaper parses the accumulated data into Huffman codewords.

5. The communication system according to claim 1, wherein the transmitter frames the channel symbols.

6. The communication system according to claim 5, wherein the framing of the channel symbols by the transmitter comprises establishing symbol frames, and wherein the symbol frames have a same symbol frame length and have a same number of modulation symbols.

7. The communication system according to claim 6, wherein the symbol frames comprise a synchronization and pointer field that comprises a synchronization subfield and a pointer subfield.

8. The communication system according to claim 7, wherein the symbol frame comprises a portion of a first data frame and a portion of a second data frame.

9. The communication system according to claim 8, wherein the pointer subfield provides an offset value indicating a location of the second portion of the second data frame.

10. The communication system according to claim 8, wherein the symbol frame does not comprises a portion of a third data frame.

11. The communication system according to claim 6, wherein the channel symbols comprise variable-length channel symbols.

12. The communication system according to claim 1, wherein the channel symbols comprise variable-length channel symbols.

13. The communication system according to claim 1, wherein the transmitting of the channel symbols by the transmitter comprises transmitting the channel symbols onto one or more communications channels.

14. The communication system according to claim 1, wherein the transmitter does not perform trellis shaping, and wherein the transmitter does not perform shell mapping.

15. The communication system according to claim 1, wherein the channel symbols comprise PAM symbols.

16. The communication system according to claim 1, wherein the channel symbols comprise QAM symbols.

17. The communication system according to claim 1, wherein the channel symbols do not form a uniform distribution.

18. The communication system according to claim 1, wherein the channel symbols are not equiprobable.

19. The communication system according to claim 1, wherein the channel symbols are equally spaced in time.

20. The communication system according to claim 1, wherein the transmitter provides Huffman shaping gains.

21. The communication system according to claim 1, wherein the channel symbols form a symbol constellation with unequal symbol probabilities and provide a shaping gain of greater than 1 dB.

22. The communication system according to claim 21, wherein the channel symbols provide a shaping gain of approximately 1.35 dB.

23. The communication system according to claim 21, wherein the channel symbols provide a shaping gain of approximately 1.5 dB.

24. The communication system according to claim 1, wherein the transmitter provides variable-rate encoded voice or video streams over one or more constant rate channels.

25. The communication system according to claim 1, wherein the scrambler is part of a source encoder, wherein the shaper is part of a channel encoder.

26. The communication system according to claim 25, wherein the channel encoder comprises the shaper and the modulator, and wherein the shaper is operatively coupled to the modulator.

27. The communication system according to claim 26, wherein the shaper comprises a Huffman decoder and a mapper, wherein the Huffman decoder is operatively coupled to the mapper and wherein the mapper is operatively coupled to the modulator.

28. The communication system according to claim 1, wherein the shaper controls a rate at which the shaper accumulates the scrambled data from the scrambler.

29. The communication system according to claim 1, wherein the channel symbols form an approximately Gaussian distribution.

30. The communication system according to claim 1, wherein the shaper comprises a mapper that maps the formed Huffman codewords into the channel symbols, and wherein the modulator provides a modulator clock to the mapper.

31. The communication system according to claim 1, comprising a receiver, wherein the receiver is operatively coupled to the transmitter over one or more communication channels.

32. The communication system according to claim 31, wherein the receiver comprises a demodulator, a Huffman encoder and a descrambler, wherein the Huffman encoder is operatively disposed between the demodulator and the descrambler.

33. The communication system according to claim 32, wherein the receiver comprises a slicer/decision element, wherein the slicer/decision element is operatively disposed between the demodulator and the Huffman encoder.

* * * * *